United States Patent
Jacobs et al.

(10) Patent No.: US 10,777,471 B2
(45) Date of Patent: Sep. 15, 2020

(54) METHOD OF DETECTING MANUFACTURING DEFECTS BY THERMAL STIMULATION

(71) Applicants: IMEC vzw, Leuven (BE); Katholieke Universiteit Leuven, Leuven (BE)

(72) Inventors: Kristof J. P. Jacobs, Duffel (BE); Ingrid De Wolf, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 16/120,061

(22) Filed: Aug. 31, 2018

(65) Prior Publication Data

US 2020/0075431 A1 Mar. 5, 2020

(51) Int. Cl.
| | | |
|---|---|---|
| H01L 21/66 | (2006.01) | |
| H01L 23/48 | (2006.01) | |
| G01N 29/04 | (2006.01) | |
| H01L 27/06 | (2006.01) | |

(52) U.S. Cl.
CPC ............ *H01L 22/12* (2013.01); *H01L 22/14* (2013.01); *H01L 23/481* (2013.01); *G01N 29/04* (2013.01); *H01L 27/0688* (2013.01)

(58) Field of Classification Search
CPC ....... H01L 22/12; H01L 22/14; H01L 23/481; H01L 27/0688; H01L 22/10; H01L 22/34
See application file for complete search history.

(56) References Cited

U.S. PATENT DOCUMENTS 6,580,281 B2  6/2003  Falk

OTHER PUBLICATIONS

Jacobs et al., "Lock-in thermal laser stimulation for non-destructive failure localization in 3-D devices," Microelectronics Reliability, 76-33 (2017), pp. 188-193, available online Jun. 27, 2017.*

(Continued)

*Primary Examiner* — Julia Slutsker
(74) *Attorney, Agent, or Firm* — Knobbe, Martens, Olson & Bear, LLP

(57) ABSTRACT

The disclosed technology generally relates to semiconductor characterization, and more particularly to detecting manufacturing defects in semiconductor regions. In one aspect, a non-destructive method of detecting a manufacturing defect in a semiconductor device includes providing a semiconductor device comprising an electrically isolated conductive via formed in a semiconductor region. The method additionally includes locally heating to cause a temperature change in a volume of the semiconductor region from a first temperature to a second temperature. The method additionally includes applying an electrical bias between the conductive via and the semiconductor region to form a temperature-dependent depletion region in the semiconductor region. The method additionally includes measuring a first capacitance value and a second capacitance value between the conductive via and the semiconductor region corresponding to the first temperature and the second temperature, respectively, of the volume of the semiconductor region. The method further includes detecting the manufacturing defect based on a difference between the first capacitance value and the second capacitance value.

19 Claims, 8 Drawing Sheets

(56) References Cited

OTHER PUBLICATIONS

Breitenstein O. et al., "Fault Localization and Functional Testing of ICs by Lock-in Thermography", Max Planck Institute of Microstructure Physics, Halle, Germany in 8 pages. 2002.
Cai et al., "Electro Optical Terahertz Pulse Reflectometry—an Innovative Fault Isolation Tool," Intel Corporation, Chandler, Arizona in 7 pages. 2010.
De Wolf I., "Failure and stress analysis of Cu TSVs using GHz-scanning acoustic microscopy and polariscopy", Imec, Leuven, Belgium in 5 pages. 2015.
Gaudestad J. et al., "Failure Analysis Work Flow for Electrical Shorts in Triple Stacked 3D TSV Daisy Chains", ISTFA 2014: Conference Proceedings from the 40th International Symposium for Testing and Failure Analysis, Houston, Texas, 2014 in 5 pages.
Imec Magazine, Edition Sep. 2017 in 58 pages.
Jacobs et al., "Defect localization of metal interconnection lines in 3-dimensional through-silicon-via structures by differential scanning photocapacitance microscopy" Appl. Phys. Lett. 12, 071905, 2018 in 5 pages.
Jacobs et al., "Light-Induced Capacitance Alteration for Non-Destructive Fault Isolation in TSV Structures for 3-D Integration," ISTFA 2016: Conference Proceedings from the 42nd International Symposium for Testing and Failure Analysis, Nov. 2016 in 8 pages.
Jacobs et al., "Lock-In Thermal Laser Stimulation for Non-Destructive Failure Localization in 3-D Devices", Imec, Leuven, Belgium in 10 pages. 2017.
Jacobs, "New technique localizes defects in 3D chips" Imec, Sep. 2017 in 6 pages.
Jing X. et al., "Non-destructive Testing of Through Silicon Vias by High-resolution X-ray/CT Techniques", Institute of Microelectronics, Chinese Academy of Sciences, Beijing, China in 4 pages; 2012.
John, "A Practical Approach to Test Through Silicon Vias (TSV)", Amkor Technology Inc., Tempe, Arizona, in 7 pages. 2016.
Kim et al., "High-Frequency Through-Silicon Via (TSV) Failure Analysis", Department of Electrical Engineering KAIST, Daejeon, South Korea in 4 pages; 2011.
Li et al., "A Review of Failure Analysis Methods for Advanced 3D Microelectronic Packages", Journal of Electronic Materials, vol. 45, No. 1, 2016 in 9 pages.
Manoj, et al. "Reliable 3-D Clock-Tree Synthesis Considering Nonlinear Capacitive TSV Model with Electrical-Thermal-Mechanical Coupling", IEEE Transactions on Computer-Aided Design of Integrated Circuits and Systems, vol. 32, No. 11, Nov. 2013.
Matsui et al., "Nondestructive fault localization of IC interconnection by using ultrasonic heating," Japanese Journal of Applied Physics 56, 07JC11 (2017) in 7 pages.
Matsumoto et al., "Resistance change observation of wiring in semiconductor device using ultrasonic stimulation" Hamamatsu, Japan in 5 pages; 2017.
Zhang L. et al., "Spatial Variation of TSV Capacitance and Method of Stabilization with Al2O3-Induced Negative Fixed Charge at the Silicon-Liner Interface," Institute of Microelectronics, A*STAR, in 4 pages; 2011.

* cited by examiner

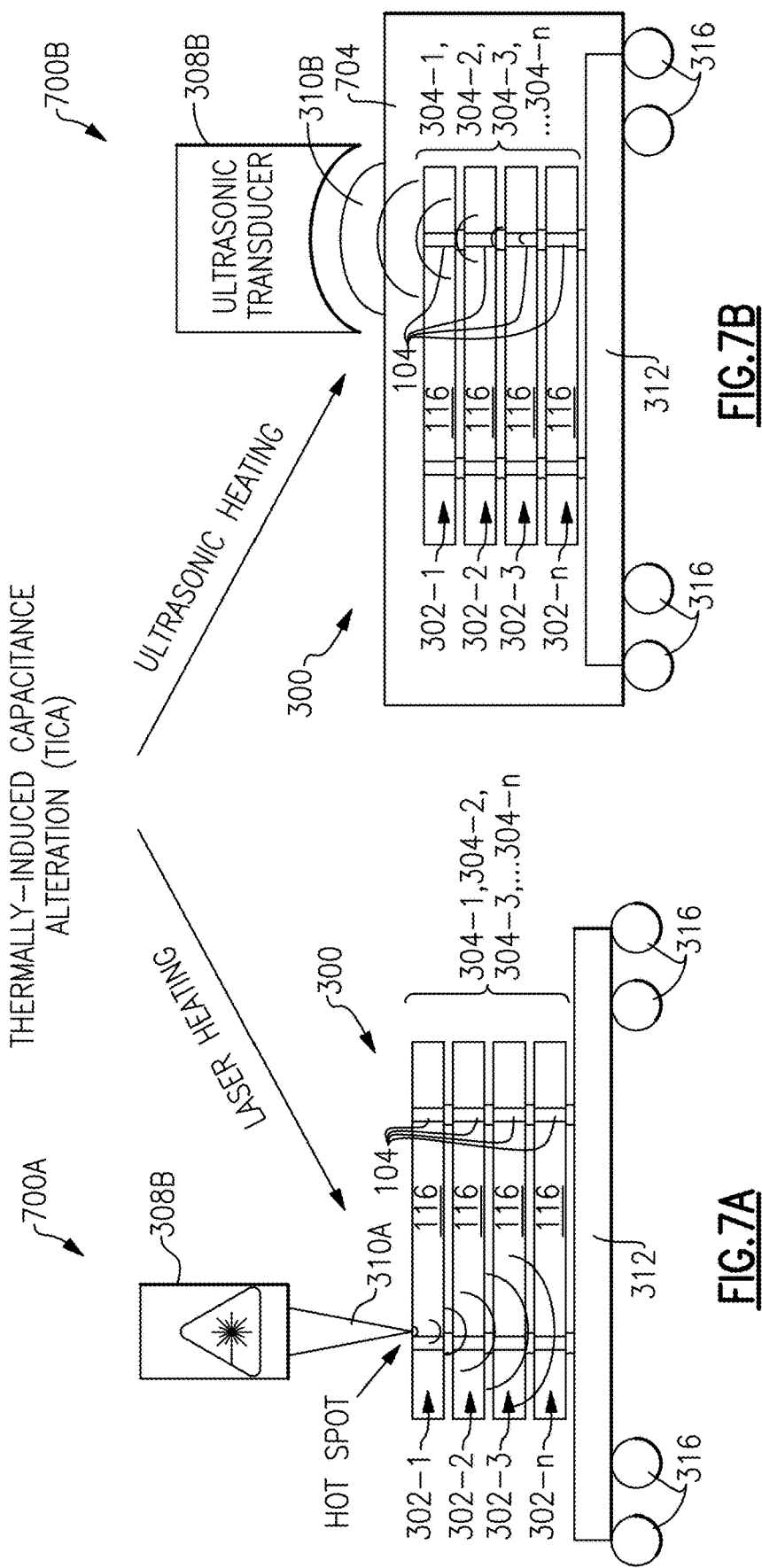

METHOD OF DETECTING MANUFACTURING DEFECTS BY THERMAL STIMULATION

BACKGROUND

Field

The disclosed technology generally relates to semiconductor characterization, and more particularly to detecting manufacturing defects in semiconductor devices.

Description of the Related Art

In a continued strive towards scaling integrated circuits (ICs) to achieve greater computing power and functionality per unit area in, vertical integration of three-dimensional (3D) ICs can enable many performance and cost benefits associated with scaling, including heterogeneous technology integration. In 3D ICs in which a plurality of IC dies are vertically stacked, different IC dies within the stack can have the same or different functionalities. Such 3D ICs can be used in high-bandwidth handheld products and high-density multi-chip memory ICs. In 3D ICs, different dies within the 3D stacked ICs can be electrically interconnected using through-silicon vias (TSVs), which can provide relatively short chip-to-chip interconnects with relatively small pad size and pitch. However, the fabrication of the TSVs include many processes such as deep Si etch, chemical vapor deposition (CVD) of dielectrics for electrical isolation of the vias, metal barrier & seed deposition and copper electroplating for via fill, and chemical mechanical polishing (CMP) to planarize the substrate, to name a few. These 3D-specific fabrication processes bring new reliability issues and failure mechanisms that can render traditional failure analysis (FA) methodologies for detecting and analyzing interconnection failures, e.g., electrical opens and shorts, impractical or ineffective. Despite rapid progress in fabrication and integration of 3D ICs, the progress in FA methodologies has been lagging. As a result, only a limited number of non-destructive techniques are available to detect and determine the location of interconnection failures in 3D ICs, including magnetic field imaging (MFI), X-ray computed tomography (CT), lock-in thermography (LIT), and electro optical terahertz pulse reflectometry (EOPTR). However, many of the available non-destructive techniques involve specialized and expensive apparatuses, may not be non-destructive, and/or may not be suitable for use as in-line detection techniques during fabrication of the 3D ICs. Thus, there is an increasing need for novel techniques adapted to detect and analyze failures in 3D ICs including TSV failures in high volume production, which can be a bottleneck for assuring reliability, yield, and performance of the 3D ICs.

SUMMARY

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

In an aspect, a non-destructive method of detecting a manufacturing defect in a semiconductor device includes providing a semiconductor device comprising an electrically isolated conductive via formed in a semiconductor region. The method additionally includes locally heating the semiconductor region to cause a temperature change in a volume of the semiconductor region from a first temperature to a second temperature. The method additionally includes applying an electrical bias between the conductive via and the semiconductor region to form a temperature-dependent depletion region in the semiconductor region. The method additionally includes measuring a first capacitance value and a second capacitance value between the conductive via and the semiconductor region corresponding to the first temperature and the second temperature, respectively, of the volume of the semiconductor region. The method further includes detecting the manufacturing defect based on a difference between the first capacitance value and the second capacitance value.

In another aspect, a non-destructive method of detecting a location of a manufacturing defect in a semiconductor device includes providing a semiconductor device comprising a plurality of electrically isolated conductive vias formed in a semiconductor region. The method additionally includes scanning a focused energetic beam in a raster format across the conductive vias, thereby locally heating to cause a temperature change in a volume of the semiconductor region adjacent to each of the conductive vias from a first temperature to a second temperature. The method additionally includes applying an electrical bias between the each of the conductive vias and the semiconductor region to form a temperature-dependent depletion region in the volume of the semiconductor region adjacent to the each of the conductive vias. The method additionally includes measuring a first capacitance value and a second capacitance value between the each of the conductive vias and the semiconductor region, where the first capacitance value and the second capacitance value correspond to the first temperature and the second temperature, respectively, of the volume of the semiconductor region adjacent to the each of the conductive vias. The method further includes determining a location of the manufacturing defect based on a difference between the first capacitance value and the second capacitance value.

In another aspect, a system for detecting a location of a manufacturing defect in a semiconductor device includes a source of an energetic beam and means for focusing the energetic beam to locally heat a semiconductor region to cause a temperature change in a volume of the semiconductor region from a first temperature to a second temperature. The system additionally includes biasing means for applying an electrical bias between a conductive via and the semiconductor region to form a temperature-dependent depletion region in the semiconductor region. The system further includes a capacitance meter configured to measure a first capacitance value and a second capacitance value between the conductive via and the semiconductor region corresponding to the first temperature and the second temperature, respectively, of the volume of the semiconductor region.

BRIEF DESCRIPTION OF THE DRAWINGS

Embodiments of the disclosed technology will now be described, by way of non-limiting examples, with reference to the accompanying drawings.

FIG. 7A schematically illustrates a system configured for detecting a manufacturing defect in a semiconductor region by locally heating using a beam of photons and measuring a change in capacitance, according to embodiments.

FIG. 7B schematically illustrates a system configured for detecting a manufacturing defect in a semiconductor region by locally heating using a beam of ultrasonic waves and measuring a change in capacitance, according to embodiments.

DETAILED DESCRIPTION

Figure 1A:
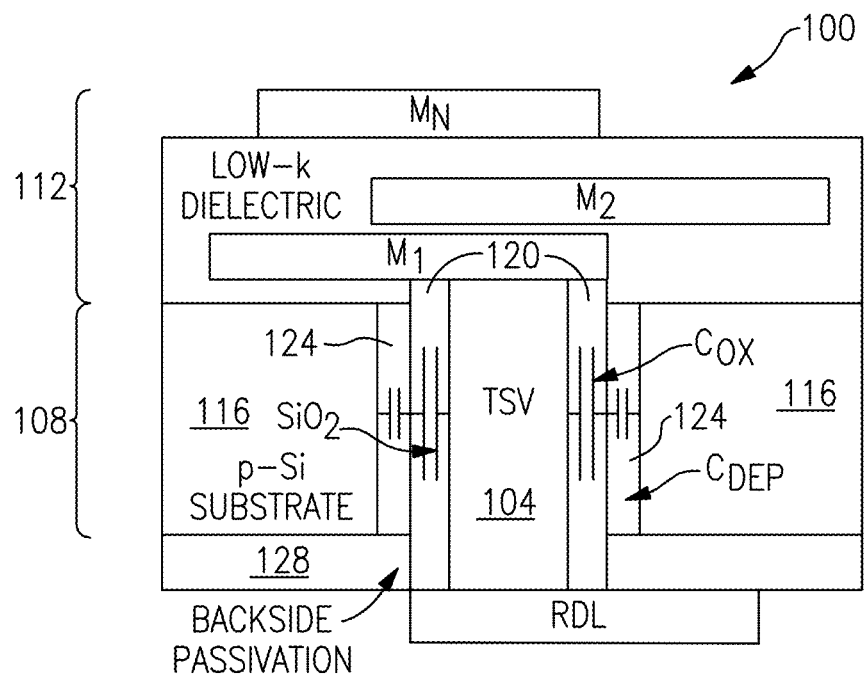
FIG. 1A schematically illustrates a cross-sectional view of an electrically isolated conductive via formed in a semiconductor region.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate substantially identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

To address the need for rapid, non-destructive, cost-effective, and scalable failure technique for detecting and/or determining a location of a manufacturing defect in 3D ICs, embodiments described herein are directed to a new method that advantageously utilizes a focused energetic beam to induce a temperature change in a semiconductor region adjacent to or surrounding a conductive via formed therein or therethrough and measuring a change in capacitance induced thereby, to detect and/or determine the location of a manufacturing defect or a failure, such as an open circuit or a short circuit. Moreover, the methods according to embodiments use relatively simple systems, which include a source of an energetic beam adapted to locally heat a semiconductor region and a capacitance meter.

In the following, embodiments may be described as including one or more semiconductor structures that are doped with a dopant of a first type. However, it will be understood that analogous structures can be implemented with a dopant of a second type opposite the first type. For example, p-doped semiconductor regions such as p-type substrate regions or heavily p-doped ($p^*$) regions can be implemented as n-doped semiconductor regions such as n-type substrate regions or heavily n-doped ($n^+$) regions.

As described throughout herein, regions of a structure that are optically inaccessible or not optically accessible refer to regions that are located below a surface of the structure such that a beam of photons cannot be directly incident thereon.

FIG. 1A schematically illustrates a cross-sectional view of an example semiconductor region 100 including an electrically isolated conductive via 104 formed therein or therethrough, e.g., a through substrate via (TSV), that can be advantageously used to implement the methods according to embodiments. The semiconductor region 100 represents a portion of an IC, which includes a semiconductor substrate 116, which in turn includes various structures formed therein using doped, deposited, and/or patterned regions as part of a front-end-of-line (FEOL) process architecture 108, including active and/or passive devices such as transistors, diodes, resistors, etc., to name a few.

As described herein and throughout the specification, it will be appreciated that the semiconductor substrate 108 can be implemented in a variety of ways, including, but not limited to, a doped semiconductor substrate or a silicon on insulator (SOI) substrate including a silicon-insulator-silicon structure in which the various structures described above are isolated from a support substrate using an insulator layer such as a buried $SiO_2$ layer. In addition, it will be appreciated that the various structures described above can be at least partially formed in an epitaxial layer formed at or near a surface region.

The semiconductor region 100 additionally includes one or more metallization levels or layers formed as part of a back-end-of-line (BEOL) process architecture 112 including, e.g., first ($M_1$) through $n^{th}$ ($M_n$) metallization levels or layers, where n can be an integer greater than 2, for instance 2 to 10. As described herein and throughout the specification, a metallization level includes laterally extending conductive structures formed of conductive materials, e.g., copper (Cu), aluminium (Al) or tungsten (W), such as metal lines, that can be patterned using a lithography mask, and also includes vertically extending conductive structures such as vias or contacts formed of conductive materials such as, e.g., Cu, Al or W, that are immediately below or above the laterally extending conductive structures. The laterally and vertically extending conductive structures are electrically insulated by dielectrics, e.g., interlayer dielectrics (ILD) or intermetal dielectrics (IMD). In the illustrated embodiment, the first metallization level $M_1$ can include the lowest level metal lines above the semiconductor substrate 116 and vias or contacts made to the semiconductor substrate 116 at, e.g., heavily doped regions such as an $n^+$ region and/or a $p^+$ region (e.g., self-aligned silicide or "salicided" contacts), within a p-type well and/or an n-type well.

Still referring to FIG. 1A, the fabrication process for forming the conductive via 104 through the semiconductor substrate 116 of the illustrated IC can include various processing steps. In various fabrication processes, after forming the FEOL 108 and BEOL 112 process architectures, the semiconductor substrate 116 may be bonded to a carrier substrate before being ground, polished or thinned from a back surface, to a suitable thickness. After forming a backside passivation layer 128, a hollow via is be formed in or through the semiconductor substrate 116 using photolithography dry etch processes, followed by deposition of an insulating layer 120 using, e.g., chemical vapor deposition (CVD) to line the hollow via. Thereafter, a thin seed layer lining the sidewalls of the hollow via may be formed on the insulating layer 120 using, e.g., physical vapor deposition (PVD), followed by filling of the hollow via with a conductive material, e.g., a metal such as Cu, to form the conductive via 120 using, e.g., using electroplating. Subsequently, a redistribution layer (RDL) may be formed by further lithography and patterning, e.g., chemical copper etching. An under bump metallization (UBM, not shown) may then be formed using, e.g., electroless nickel plating, followed by solder paste stencil printing and reflow to form a solder ball for electrically connecting to other IC layers.

Thus formed semiconductor region 100 includes the conductive via 104 that electrically connects a metallization structure at the front side of the semiconductor substrate 116, e.g., $M_1$ metal lines in the illustrated embodiment, to a metallization structure at the backside of the semiconductor substrate 116, e.g., a redistribution layer (RDL) in the illustrated embodiment, though the bulk semiconductor material, e.g., silicon (Si), of the semiconductor substrate 116. The semiconductor region 100 additionally includes the insulating layer 120, e.g., $SiO_2$ or $Si_3N_4$, that surrounds to electrically isolate the conductive via 104 from the semiconductor substrate 116. Thus formed, the semiconductor region 100 includes the conductive via 104, the insulating layer 120 and the semiconductor substrate 116 configured as a metal/insulator/semiconductor (MIS) structure. It will be appreciated that the resulting MIS structure can be modeled as a series combination of capacitors having a dielectric layer oxide capacitance (Cox) and a bias-, light-, and temperature-dependent depletion layer capacitance (CDEP) formed in the semiconductor substrate 116, as described below.

Figure 1B:
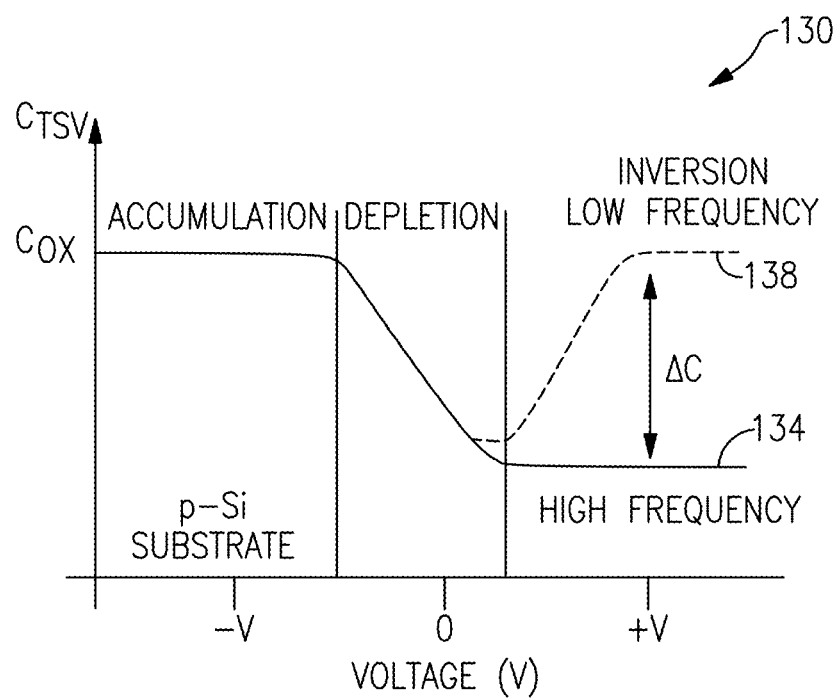
FIG. 1B schematically illustrates a capacitance-voltage curve measured between the conductive via and the semiconductor region illustrated in FIG. 1A.

FIG. 1B schematically illustrates a capacitance-voltage (CV) curve 130 measured between the conductive via 104, e.g., a TSV, and the semiconductor substrate 116 illustrated in FIG. 1A. The CV curve includes three bias regimes referred to as accumulation, depletion, and inversion regimes. For the illustrated example in which the semiconductor substrate 116 is a p-type substrate, when a negative bias is applied between the conductive via 104 and the semiconductor substrate 116, the substrate volume at the semiconductor/insulator interface is in the accumulation regime and the capacitance reaches a maximum as the majority carriers, i.e., holes of the p-type semiconductor substrate 116 are attracted to the semiconductor insulator interface to form a conductive layer of holes. In this biasing regime, the measured capacitance is approximately equivalent to the capacitance Cox of the insulating layer 120. When the bias is swept from a negative to positive voltage, the substrate volume at the semiconductor/insulator interface becomes progressively depleted of the holes, and a depletion region 124 (FIG. 1A) is formed, which progressively increases in thickness as bias becomes more positive. The associated depletion capacitance reduces as a consequence and reaches a minimum at the onset bias of the inversion regime. In the inversion regime, the depletion region does not further extend and an inversion layer of minority carriers, i.e., electrons, is formed at the semiconductor/insulator interface. The minority carriers in the inversion regime have generation and recombination times that are typically between 0.01 sec. and 0.1 sec. As a result, the inversion capacitance depends on the frequency at which the capacitance is measured, and the measured high (HF) and low frequency (LF) inversion capacitance values 134, 138 are different, as illustrated in FIG. 1B. If the applied test frequency is sufficiently high, e.g., greater than 100 Hz, the inversion layer charge cannot be generated fast enough relative to the applied test signal, and the measured capacitance becomes equivalent to combination of Cox in series with CEP. For low frequency capacitance measurements, e.g., less than 100 Hz, the measured capacitance approaches Cox as the inversion layer charge follows the applied test signal. The difference in inversion capacitance under low and high frequencies is represented by $\Delta C$.

Figure 2B:
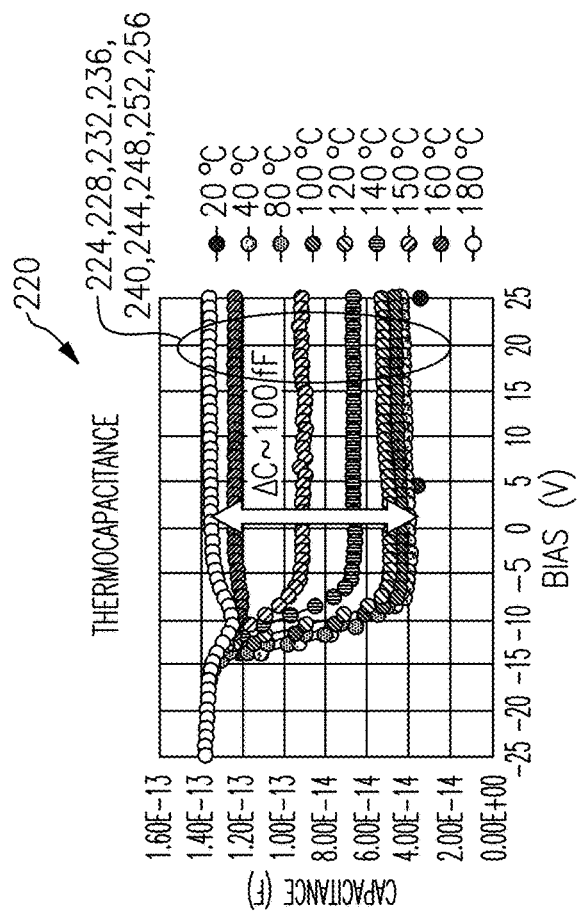
FIG. 2B illustrates experimental capacitance-voltage curves measured between the conductive via and the semiconductor region illustrated in FIG. 1A under different heating conditions.
Figure 2A:
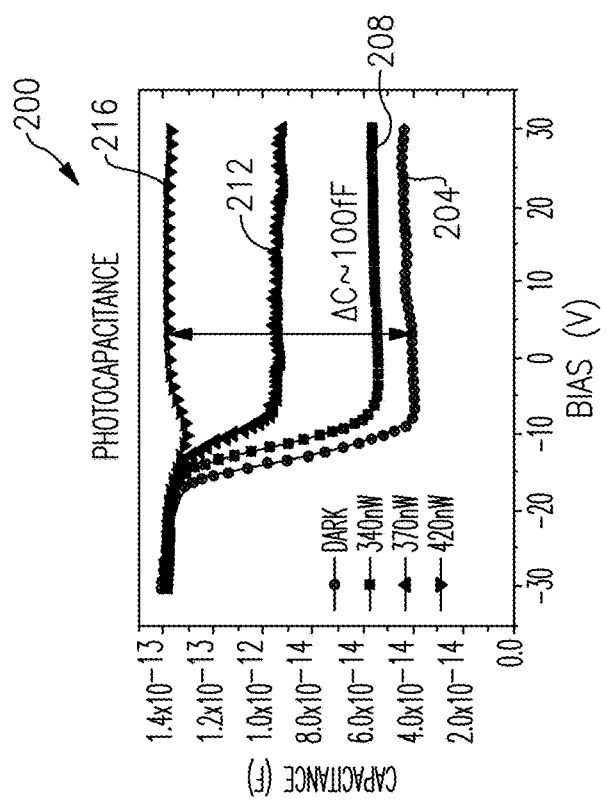
FIG. 2A illustrates experimental capacitance-voltage curves measured between the conductive via and the semiconductor region illustrated in FIG. 1A under different illumination conditions.
Figure 4:
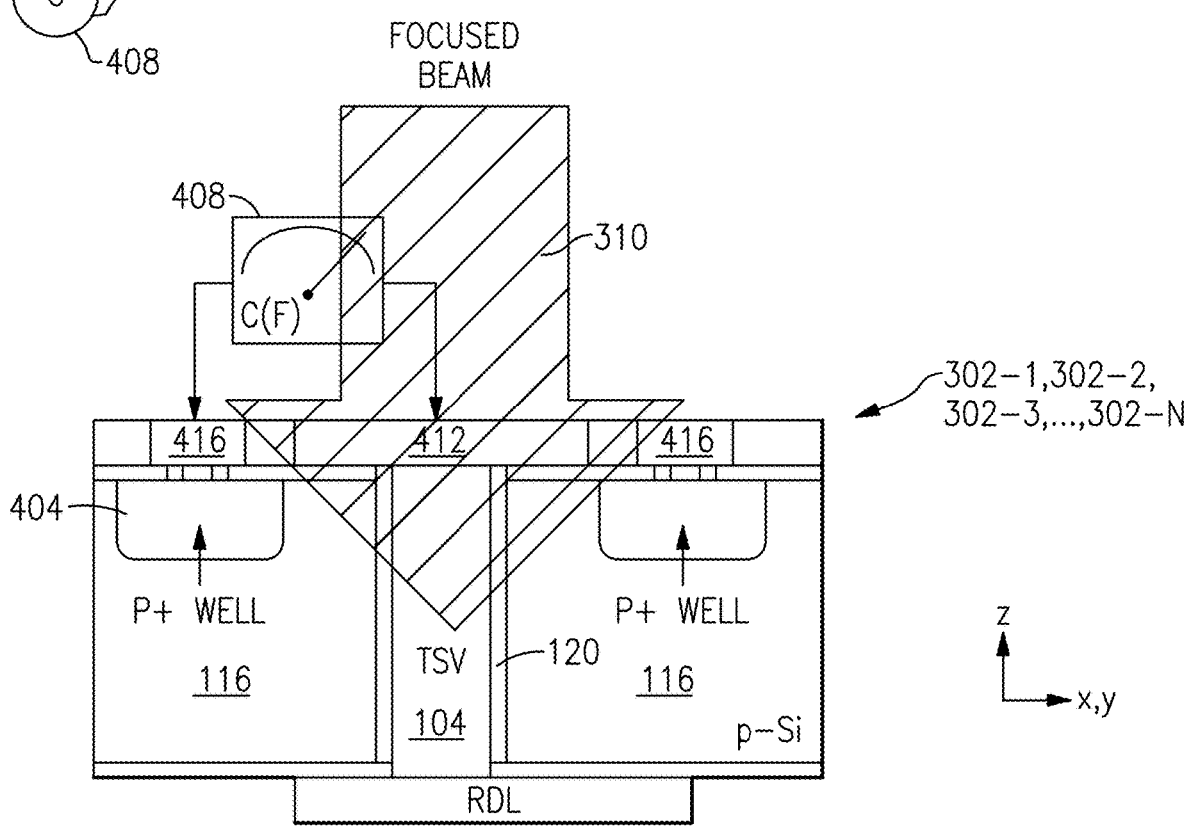
FIG. 4 schematically illustrates a method of detecting a manufacturing defect in a semiconductor region by locally heating and measuring a change in capacitance, according to embodiments.

As described above, when the measurement frequency is relatively high (HF), the inversion layer cannot respond to the applied test signal as the thermal carrier generation rate in the substrate is insufficient at room temperature. However, the carrier generation rate can be enhanced by an external stimulus such as illumination and heat, which enhanced generation rate is exploited in the disclosed methods according to embodiments. FIGS. 2A and 2B illustrate experimental HF CV curves 200 and 220 measured at 10 kHz between the conductive via 104 (FIG. 1A) and the semiconductor substrate 116 (FIG. 1A) in which the carrier generation rate in the volume of the semiconductor region is enhanced by different external stimuli. FIG. 2A illustrates experimental CV curves measured between the conductive via and the semiconductor region illustrated in FIG. 1A under different illumination conditions. In FIG. 2A, the external stimulus is light, which enhances the carrier generation rate, and the resulting HF CV curves are referred to herein as photocapacitance-voltage curves. Referring to FIGS. 2A and 1A, the HF CV curves 204, 208, 212 and 216 (FIG. 2A) were measured by sweeping the voltage between the conductive via 104 (FIG. 1A) and the semiconductor substrate 116 (FIG. 1A) from accumulation to inversion at room temperature under a 0 W of illumination, 340 nW of illumination, 370 nW of illumination and 420 nW of illumination, respectively. The electrical contact to the semiconductor substrate 116 (FIG. 1A) which surrounds the conductive via 104 (FIG. 1A) was made through a $p^+$ region (not shown in FIG. 1A, but similar as shown in FIG. 4). As discussed in reference to FIG. 1B, in the absence of photoexcitation, a decrease in capacitance was observed as the voltage is swept from a negative bias corresponding to the accumulation regime to a positive bias corresponding to the inversion regime. As described above, the low capacitance values in the HF CV curve 204 under positive bias conditions is attributed to the slow thermal carrier generation rate in the substrate, which prevents the supply of carriers from the test signal to reach the inversion layer. In contrast, under illumination conditions, a progressively increasing inversion capacitance is observed with increasing illumination intensity, which is caused by enhanced carrier generation due to the absorption of light having energy greater than the band gap of the semiconductor substrate 116 (e.g., 1.1 eV in silicon). A ~100 fF difference in capacitance was measured between 0 W and 420 nW of illumination under strong inversion. This corresponds to over 70% change in capacitance ΔC for a maximum measured capacitance of about 140 fF under accumulation. This change in capacitance induced by photogeneration of electrical carriers can be advantageously used to detect manufacturing defects associated with semiconductor regions having conductive vias formed therein or therethrough that are optically accessible.

The inventors have found that, unlike the CV curves 200 illustrated in FIG. 2A in which the change in capacitance ΔC is induced by photogeneration, the change in capacitance ΔC can advantageously be induced by thermal generation. As described infra, ΔC induced by thermal generation can be advantageously used to detect manufacturing defects regardless of whether or not they are optically accessible. In FIG. 2B, the external stimulus that accelerates the generation of electrical carriers is heat, instead of light, and the resulting HF CV curves 220 are referred to herein as thermocapacitance-voltage curves. Referring to FIGS. 2B and 1A, the HF CV curves 224, 228, 232, 236, 240, 244, 248, 252 and 256 (FIG. 2B) were measured by sweeping the voltage between the conductive via 104 (FIG. 1A) and the semiconductor substrate 116 (FIG. 1A) from accumulation to inversion under a dark condition in which the semiconductor region 100 is at temperatures of 20° C., 40° C., 80° C., 100° C., 120° C., 140° C., 150° C., 160° C., and 180° C., respectively. The electrical contact to the semiconductor substrate 116 (FIG. 1A) which surrounds the conductive via 104 (FIG. 1A) was made through a p+ region (not shown in FIG. 1A, but similar to that shown in FIG. 4). As discussed in reference to FIG. 1B, in the absence of thermoexcitation, a decrease in capacitance was observed as the voltage is swept from a negative bias corresponding to the accumulation regime to a positive bias corresponding to the inversion regime. As described above, the low capacitance values in the HF CV curve 204 under positive bias conditions is attributed to the slow thermal carrier generation rate in the substrate, which prevents the supply of carriers from the test signal to reach the inversion layer. In contrast, under heated conditions, a progressively increasing inversion capacitance is observed with increasing temperature, which is caused by enhanced thermal carrier generation due to increase in the temperature of the semiconductor region. Comparable to changes in photocapacitance values under illumination as described above with respect to FIG. 2A, a ~100 fF difference in capacitance was measured between 20° C. and 180° C. under strong inversion. This corresponds to over 70% change in capacitance ΔC for a maximum measured capacitance of about 140 fF under accumulation. The inventors have found that this change in capacitance induced by generation of electrical carriers can be advantageously used to detect manufacturing defects associated with semiconductor regions having conductive vias formed therein or therethrough, regardless of whether they are optically accessible, according to various embodiments.

It will be appreciated that, referring to FIGS. 2A and 2B, under relatively high measurement frequency (HF) conditions, the photocapacitance and thermocapacitance values under depletion and inversion regimes are sensitive to illumination and elevated temperatures, while the photocapacitance and thermocapacitance values under accumulation are relatively insensitive to either illumination or elevated temperatures. As described below, methods according to some embodiments utilize changes in capacitance values (ΔC) in response to a change in temperature of the semiconductor region surrounding the conductive via, and therefore the methods according to various embodiments measure the ΔC under depletion or inversion regimes. However, embodiments are not so limited, and the ΔC can be used to detect some manufacturing defects.

Figure 3:
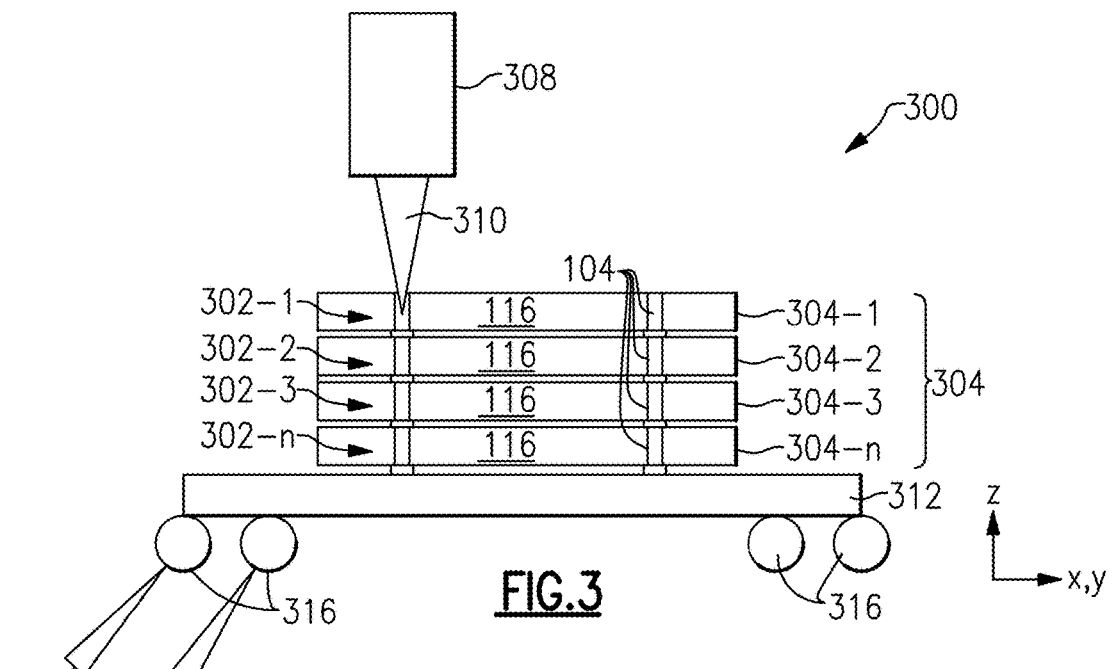
FIG. 3 schematically illustrates a method of detecting a manufacturing defect in a semiconductor region in a three-dimensional (3D) integrated circuit (IC) device by locally heating and measuring a change in capacitance, according to embodiments.

FIGS. 3 and 4 schematically illustrate a non-destructive method of detecting a manufacturing defect in a semiconductor region in a three-dimensional (3D) integrated circuit (IC) device by locally heating and measuring a change in capacitance, according to embodiments. The method includes providing a semiconductor device 300 (FIG. 3) comprising one or more electrically isolated conductive vias 104 formed therein or therethrough. In the illustrated embodiment, the semiconductor device 300 includes a stack 304 including a plurality of IC dies 304-1, 304-2, 304-3, . . . 304-n stacked on a substrate 312. However, embodiments are not so limited and in other embodiments, the semiconductor 300 may include only one IC die.

Each of the IC dies 304-1, 304-2, 304-3, . . . 304-n includes an electrically isolated conductive via 116 formed in a respective one of the semiconductor regions 302-1, 302-2, 302-3, . . . 302-n. The arrangement and physical characteristics of the electrically isolated conductive via 104 are similar to those described supra, and their detailed descriptions are omitted herein for brevity. Similarly, the arrangement and physical characteristics of each of the semiconductor regions 302-1, 302-2, 302-3, . . . 302-n are similar to those described supra, and their detailed descriptions are omitted herein for brevity.

Still referring to FIGS. 3 and 4, the method additionally includes, using a source 308 to generate an energetic beam 310, which may be focused, to locally heat a volume of one or more of the semiconductor regions 302-1, 302-2, 302-3, . . . 302-n, thereby causing a temperature change in the volume of the one or more of the semiconductor regions 302-1, 302-2, 302-3, . . . 302-n from a first temperature (T1) to a second temperature (T2). As described infra, the source 308 of the energetic beam 310 may be a source of a beam of photons such as a laser (FIG. 7A, FIG. 9) configured to generate a beam of light with high intensity, or source of a beam of ultrasonic waves such as an ultrasonic transducer (FIG. 7B, FIG. 8) configured to generate ultrasonic waves. In various embodiments, the energetic beam 310 can be focused laterally (in x and/or y directions) and vertically (in z direction), such that a volume within one or more of the semiconductor regions 302-1, 302-2, 302-3, . . . 302-n is substantially selectively locally heated relative to volumes within the others of the semiconductor regions 302-1, 302-2, 302-3, . . . 302-n. According to various embodiments, the local heating is such that each of the first and second temperatures T1, T2 of the volume within one of the semiconductor regions 302-1, 302-2, 302-3, . . . 302-n, corresponding to the temperatures before and after the local heating, can be any two initial and final temperatures within any two ranges defined by 0° C., 20° C., 40° C., 80° C., 100°

C., 120° C., 140° C., 160° C., 180° C., 200° C., 220° C., 240° C., 260° C., 280° C., 300° C.

Still referring to FIGS. 3 and 4, according to various embodiments, the method additionally includes applying an electrical bias between a conductive via 104 and a heated one of the semiconductor regions 302-1, 302-2, 302-3, . . . 302-n, to obtain a temperature-dependent depletion region 124 (FIG. 1A) in the heated one of the semiconductor regions 302-1, 302-2, 302-3, . . . 302-n. The electrical bias may be generated by the capacitance meter 408. In the illustrated example in FIG. 4, the electrical bias may be generated between a contact pad 412 connected to the conductive via 104 and a contact pad 416 connected to the heated one of the semiconductor regions 302-1, 302-2, 302-3, . . . 302-n, which may be through a heavily doped (e.g., $p^+$) region 404 to reduce the contact resistance. A detailed description of the physical process of obtaining a temperature-dependent depletion region 124 (FIG. 1A) has been described in detail supra, and is omitted herein for brevity. According to various embodiments, under the localized heating condition described above, the applied bias is such that a temperature-dependent depletion region 124 (FIG. 1A) is formed within the volume of the heated one of the semiconductor regions 302-1, 302-2, 302-3, . . . 302-n, adjacent to the electrically isolated conductive via 104 under test. As described supra, the temperature-dependent depletion region 124 is formed when the biasing voltage corresponds to the depletion bias regime or the inversion bias regime.

Still referring to FIGS. 3 and 4, according to various embodiments, the method additionally includes measuring a first capacitance value and a second capacitance value, using the capacitance meter 408, between the conductive via 104 under test and the heated one or more of the semiconductor regions 302-1, 302-2, 302-3, . . . 302-n. The conductive via 104 under test and the semiconductor regions 302-1, 302-2, 302-3, . . . 302-n may be electrically accessed by a capacitance meter 408 through one or more solder balls 316 (FIG. 3) or through contact pads 416, 412 (FIG. 4). The first capacitance value and the second capacitance value corresponds to the first temperature and the second temperature, respectively, of the volume of the heated one of the semiconductor regions 302-1, 302-2, 302-3, . . . 302-n. According to various embodiments, when the applied bias is such that the heated one of the semiconductor regions 302-1, 302-2, 302-3, . . . 302-n is in an inversion regime or a depletion regime, a change in the value of the depletion or inversion capacitance, or a difference $\Delta C$ before and after heating, has a value within a range defined by any two values illustrated in FIG. 2B, on the basis of a percentage of the accumulation capacitance. For example, without limitation, the $\Delta C$ may have a range defined by any two values of 0.1%, 1%, 10%, 20%, 30%, 40%, 50%, 60%, 70%, 80%, 90% and 100% with respect to the accumulation capacitance. According to various embodiments, the method additionally includes detecting the manufacturing defect based on this difference between the first capacitance value and the second capacitance value.

By way of example, referring back to FIG. 2B, to obtain a detectable change in capacitance $\Delta C$ of 100 fF, the first and second temperatures T1, T2, corresponding to initial and final temperatures of a volume of the heated one of the semiconductor regions 302-1, 302-2, 302-3, . . . 302-n, can be 20° C. and 180° C. The corresponding change in the inversion capacitance change is between 70% and 80% of the accumulation capacitance.

In the illustrated embodiment in FIG. 3, the semiconductor device 300 comprises a stack 304 including a plurality of IC dies 304-1, 304-2, 304-3, . . . 304-n. While embodiments are not so limited, the methods according to various embodiments are particularly advantageous when a manufacturing defect is located below a surface of the semiconductor device 300, e.g., in one of the IC dies 304-2, 304-3, . . . 304-n that may be disposed below the IC die 304-1. This is because, unlike existing non-destructive techniques, methods according to embodiments are adapted to detect manufacturing defects that may be formed at a location that is not optically accessible. The methods according to embodiments are so adapted because, as described infra, the energetic beams can be focused not only laterally in a plane parallel to the main surface of the semiconductor device 300, e.g., x and y directions, but can also be focused in a direction perpendicular to the main surface of the semiconductor device 300, e.g., in a z-direction.

Figure 5A:
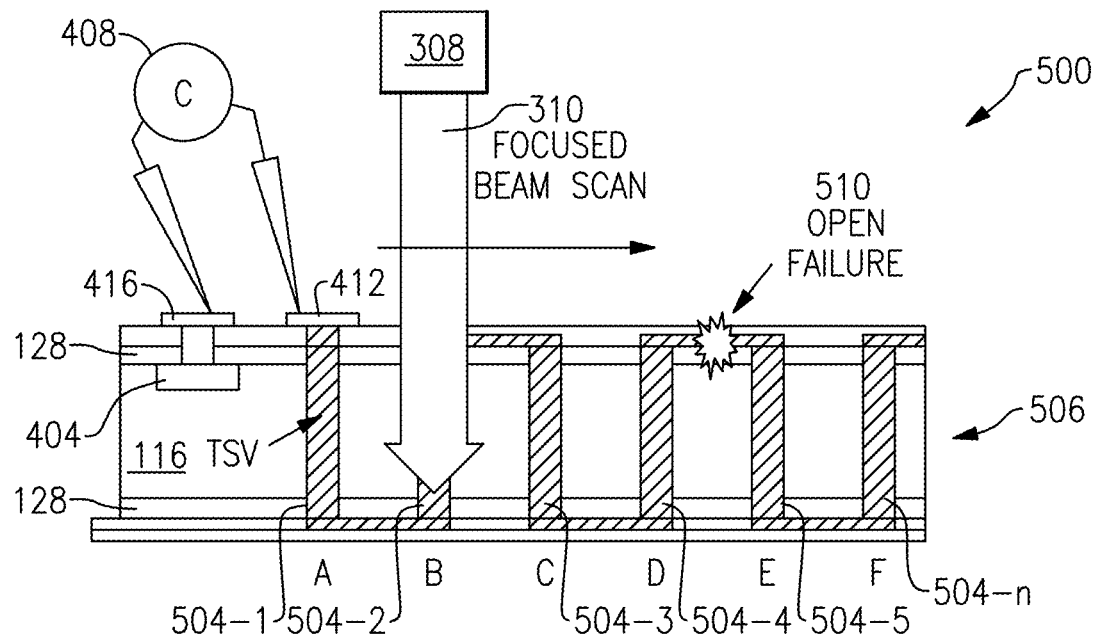
FIG. 5A schematically illustrates a method of determining a location of a manufacturing defect in a semiconductor region by scanning a focused energetic beam across a semiconductor region and measuring a change in capacitance induced by a temperature change, according to embodiments.

FIG. 5A schematically illustrates a non-destructive method of detecting and determining a location of a manufacturing defect in a semiconductor region by scanning a focused energetic beam 310 of photons or ultrasonic waves across a semiconductor region and measuring a change in capacitance induced by a temperature change therein, according to embodiments. The method is described with respect to the illustrated semiconductor device 500 by way of example, which comprises a semiconductor substrate 116 having a semiconductor region 506 formed therein. The semiconductor region 506 comprises a plurality of electrically isolated conductive vias 504-1, 504-2, 504-3, . . . 504-n, formed therein or therethrough, at corresponding lateral locations A, B, C, . . . N, respectively, where n and N can be any suitable number. Adjacent conductive vias are electrically connected through a lateral connection formed over passivation layers 128 on the bottom or the top surface of the semiconductor substrate 116, such that the conductive vias 504-1, 504-2, 504-3, . . . 504-n form a serially connected chain of conductive vias referred to herein as a daisy chain. While the illustrated daisy chain serves illustrative purposes, embodiments are not limited thereto, and the lateral connections between adjacent ones of the conductive vias 504-1, 504-2, 504-3, . . . 504-n can be omitted. By way of illustration, the daisy chain has a defect or a failure 510, e.g., an open circuit failure, at a lateral location between the location D and the location F. In a similar manner as described above with respect to FIGS. 3 and 4, when the energetic beam 310 has sufficient energy, a volume within the semiconductor region 506 can be heated from a first temperature to a second temperature. The conductive vias 504-1, 504-2, 504-3, . . . 504-n are configured to be biased relative to the semiconductor region 506 through a contact pad 412 electrically connected to the daisy chain and a contact pad 416 electrically connected to the substrate 116. In the illustrated method, the location of the failure 510 that interrupts the electrical connectivity in the daisy chain can be detected through a change in thermocapacitance that is measured using a capacitance meter 408 configured to measure a capacitance between the contact pad 412 and the contact pad 416, while the energetic beam 310 is scanned from the location B to location F. In the illustrated method, the energetic beam 310, which can be a focused energetic beam of photons or ultrasonic waves, is scanned across the plurality of conductive vias 504-1, 504-2, 504-3, . . . 504-n, to locally heat a volume of the semiconductor region adjacent to each of the conductive vias 504-1, 504-2, 504-3, . . . 504-n under test, from a first temperature to a second temperature, in a similar manner as described supra.

In some embodiments, the energetic beam 310 is scanned in a raster format, while embodiments are not so limited. As the energetic beam 310 is scanned, an electrical bias is applied between the each of the conductive vias 504-1, 504-2, 504-3, . . . 504-n under test and the corresponding volume of the semiconductor region 506 to form a temperature-dependent depletion region therein, in similar manner as described supra. Under the bias in which the semiconductor region 506 is in a depletion regime or an inversion regime, a first capacitance value and a second capacitance value between the each of the conductive vias 504-1, 504-2, 504-3, . . . 504-n under test and the semiconductor region 506 are measured. The first capacitance value and the second capacitance value correspond to the first temperature and the second temperature, respectively, of the volume of the semiconductor region 506 corresponding to the each of the conductive vias 504-1, 504-2, 504-3, . . . 504-n under test. In a similar manner as described supra, a location of the manufacturing defect is determined based on a difference $\Delta C$ between the first capacitance value and the second capacitance value.

Figure 5B:
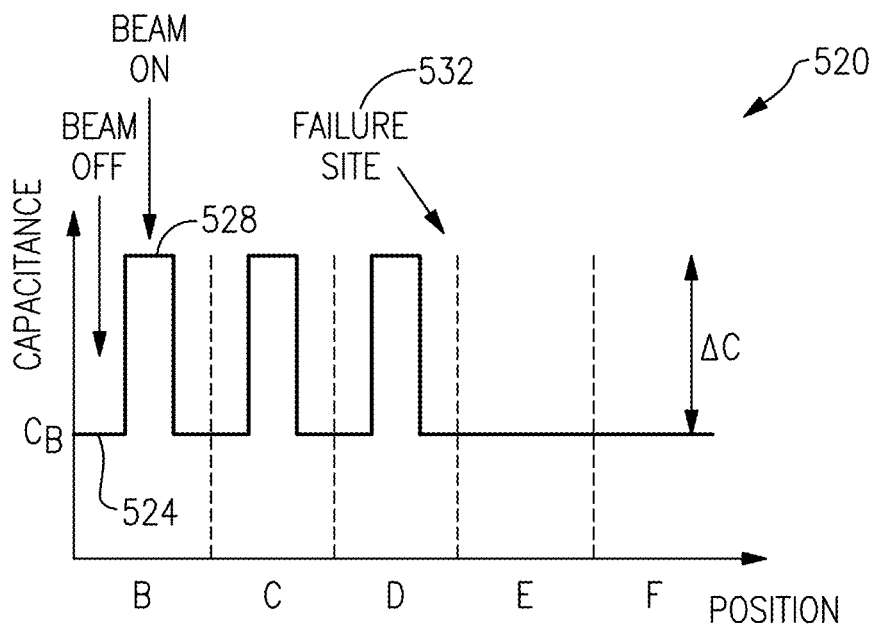
FIG. 5B schematically illustrates a trace of capacitance measured as a function of position obtained by scanning the focused energetic beam across the semiconductor region as illustrated in FIG. 5A, according to embodiments.

FIG. 5B schematically illustrates a trace 520 of capacitance measured as a function of position obtained by scanning the energetic beam 310 across the semiconductor region 506 as illustrated in FIG. 5A, according to embodiments. As shown, when the energetic beam 310 is switched off, the measured capacitance is at a baseline capacitance 524 (CB), which is associated with a metal/insulator/semiconductor (MIS) capacitance of the daisy chain including serially connected conductive vias 504-1, 504-2, 504-3 and 504-1 at lateral locations A, B, C and D, respectively, as well as parasitic bondpad and interconnect capacitances. The CB 524 corresponds to the capacitance associated with the MIS capacitance of the daisy chain at a first temperature or an initial temperature, e.g., room temperature, prior to substantial thermal generation of carriers in the depletion regime or the inversion regime. When the energetic beam 310 is switched on and incident sequentially on locations B, C, and D, an increased capacitance 528 is detected. The increased capacitance corresponds to the thermocapacitance associated with the MIS capacitance of the daisy chain at a second temperature sufficient to generate the change in capacitance $\Delta C$, as described above. In the daisy chain configuration illustrated in FIG. 5A, when the failure 510 is an open circuit failure, the thermocapacitive signal may not be detectable at locations E and F, as the conductive vias 504-5 and 504-n in these locations may be electrically isolated from the capacitance meter 408 by the open circuit condition. By comparing the trace 520 of the measured capacitance shown in FIG. 5B to a physical layout of the semiconductor device 300, it can be determined that the open failure 510 between the conductive vias 504-4 and 504-5, between locations D and E.

The illustrated daisy chain in FIG. 5A may serve as a test structure to detect manufacturing defects and/or to characterize manufacturing parameters associated with the conductive vias. However, it will be understood that embodiments are not so limited, and the conductive vias 504-1, 504-2, 504-3, . . . 504-n may be electrically separated structures that serve primarily as inter-die interconnect structures instead of as test structures, where the lateral connections between adjacent ones of the conductive vias 504-1, 504-2, 504-3, . . . 504-n may not be present. It will be appreciated that the methods described herein are equally applicable to such inter-die interconnect structures that are not test structures. In the absence of the lateral connections between the conductive vias 504-1, 504-2, 504-3, . . . 504-n, a measured change in capacitance will be indicative of a manufacturing defect associated with a specific one of the conductive vias 504-1, 504-2, 504-3, . . . 504-n under test. On the other hand, in the daisy structure described above, measured change in capacitance may be indicative of a manufacturing defect associated within continuous ones of the conductive vias 504-1, 504-2, 504-3, . . . 504-n.

In addition, while the change in capacitance $\Delta C$ may be directly measured through the contact pads 412, 416 using the capacitance meter 408 as described with respect to FIG. 5A, embodiments are not so limited. According to some embodiments, the change in capacitance may be indirectly measured by measuring changes in device parameters associated with local changes in capacitance. For example, an increased capacitance associated with a conductive via may cause an increase in RC delay in signal transmission. Thus, by mapping RC delays while locally heating semiconductor regions associated with conductive vias in signal transmission circuitry, the presence of manufacturing defects can be indirectly detected.

Figure 6A:
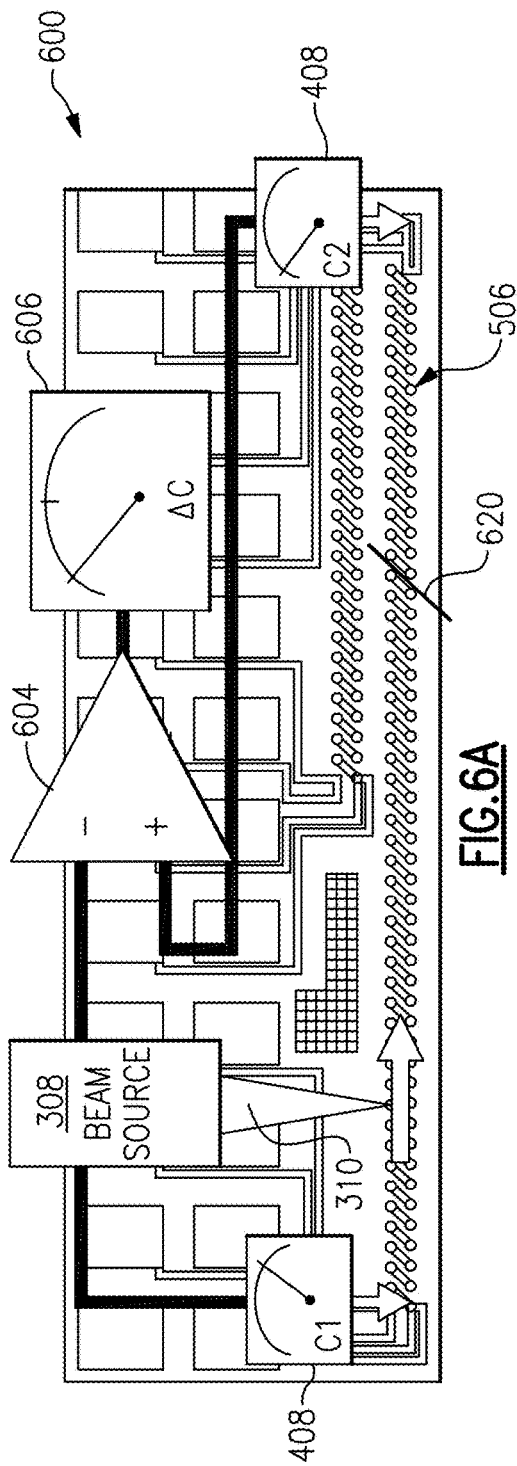
FIG. 6A schematically illustrates a method of determining a location of a manufacturing defect in a semiconductor region by scanning a focused energetic beam across a semiconductor region and measuring a differential capacitance induced by a temperature change, according to embodiments.
Figure 6B:
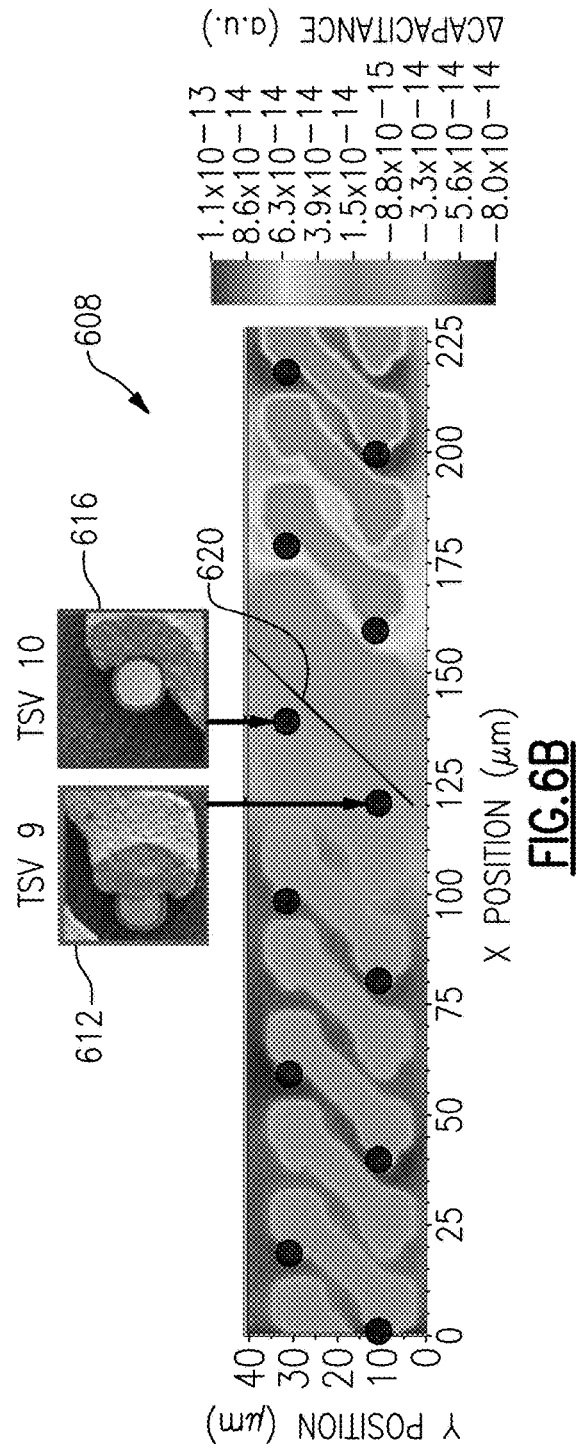
FIG. 6B schematically illustrates a map of differential capacitance measured by scanning the focused energetic beam across the semiconductor region as illustrated in FIG. 6A, according to embodiments.

Based on the above, the inventors have recognized that the method can be implemented as a modified scanning capacitance microscopy technique to determine the location of a failure, e.g., a metallization line rupture, as described herein with respect to FIGS. 6A and 6B. FIG. 6A schematically illustrates a method of determining a location of a manufacturing defect in a semiconductor region 600 by scanning a focused energetic beam 310 across a semiconductor region and measuring a differential capacitance induced by a temperature change, according to embodiments. The semiconductor region 600 comprises a plurality of conductive vias 506. While embodiments are not so limited, for illustrative purposes, the conductive vias 506 in the illustrated example are arranged as two interwoven daisy chains, where each daisy chain is arranged as described above with respect to FIG. 5A. A failure 616, e.g., an open circuit failure, may be present along a conductive path of the daisy chain, in a similar manner as described above with respect to FIGS. 5A and 5B. In the illustrated embodiment, a focused energetic beam 310 of photons or ultrasonic waves is scanned over the surface of the semiconductor region 600 while a differential capacitance is measured between the chain terminals using a differential amplifier 604. The energetic beam 310 is focused to a small spot on the surface of the semiconductor region 600 to locally heat to induce thermocapacitance in a depletion regime or an inversion regime, in a similar manner as described above. The thermocapacitance signal is detected with a differential capacitance meter 606 connected to the differential amplifier 604. Advantageously, the illustrated differential measurement configuration can enable an increased sensitivity by reducing common-mode noise and parasitic effects that can influence the measurement, as compared to a single-ended measurement. In the illustrated method, a differential capacitance value having one of a positive or a negative value (a negative value in the illustrated example) is observed relative to a differential capacitance value measured at the failure 616, when the energetic beam 310 of photons or ultrasonic waves is incident on one of the conductive vias 506 that are located to the left side of the failure 616. On the other hand, a differential capacitance value having the other one of a positive or a negative value (a positive value in the illustrated example) is observed relative to the differential capacitance value measured at the failure 616, when the energetic beam 310 is incident on one of the conductive vias 506 that are located to the right side of the failure 616. When the energetic beam 310 is incident on the failure 616, where an open circuit may be present, the output of the differential amplifier 604 is about zero, as the energetic beam 310 induces an equal change in capacitance on both sections of the daisy chain. Advantageously, in the illustrated method, the zero-crossing point of the differential capacitance therefore identifies the location of the failure 616 along the path in which the energetic beam 310 is scanned.

FIG. 6B schematically illustrates a differential capacitance map 608 of measured differential capacitance that may be obtained by scanning the focused energetic beam 310 as described above with respect to FIG. 6A, according to embodiments. The illustrated differential capacitance map 608 is that of one of the daisy chains that includes the failure 616. Upon detection of the failure 616 using the method, the physical presence of the failure 616, which included a metallization line rupture, was determined by scanning electron microscopy (SEM). The two SEM images are those of the conductive vias at the location of a failure 616 (TSV 10) and a normal non-failed location 612 (TSV 9) in the daisy chain and indicate that the failure 616 is caused by a metallization rupture due to a backside metal layer misalignment. The differential capacitance map 608 shows a gradient map of differential capacitance as a function of the beam position in X and Y positions. The differential capacitance map 608 shows a negative-to-positive differential signal transition from left to right at certain locations, which indicates the presence of a failure, e.g., an open failure, according to embodiments. In the illustrated embodiment, the diagonal line 620 indicates locations at which differential capacitance values are about zero It will be appreciated that the temperature-induced charge is balanced between both sides of the diagonal line 620 that are separated by the failure 616, e.g., an open circuit formed by a rupture.

In the above, various embodiments were described in which an energetic beam of photons or ultrasonic waves is used to thermally generate carriers within a semiconductor volume adjacent to a conductive via under test in a semiconductor region, and a change in capacitance arising therefrom is measured to detect and locate a manufacturing defect. Referring to FIGS. 7A and 7B, the inventors have recognized that the energetic beam can be a beam 310A (FIG. 7A) of photons, e.g., a laser beam, or a beam 310B (FIG. 7B) of ultrasonic waves. In the following, a system 700A and methods associated with using a beam 310A of photons for detecting a manufacturing defect are described with respect to FIGS. 7A and 9, and a system 700B and methods associated with using a beam 310B of ultrasonic waves are described with respect to FIGS. 7B and 8. In each of FIGS. 7A, 7B, 8 and 9, the semiconductor device 300 being tested is arranged similarly as the semiconductor device 300 described above with respect to FIGS. 3 and 4, and comprises a 3D stack 304 of IC dies 304-1, 304-2, 304-3, . . . 304-n, where each of the IC dies includes a plurality of electrically isolated conductive vias 104 formed in a respective one of the semiconductor regions 302-1, 302-2, 302-3, . . . 302-n, and a detailed description thereof is omitted herein for brevity.

Figure 9:
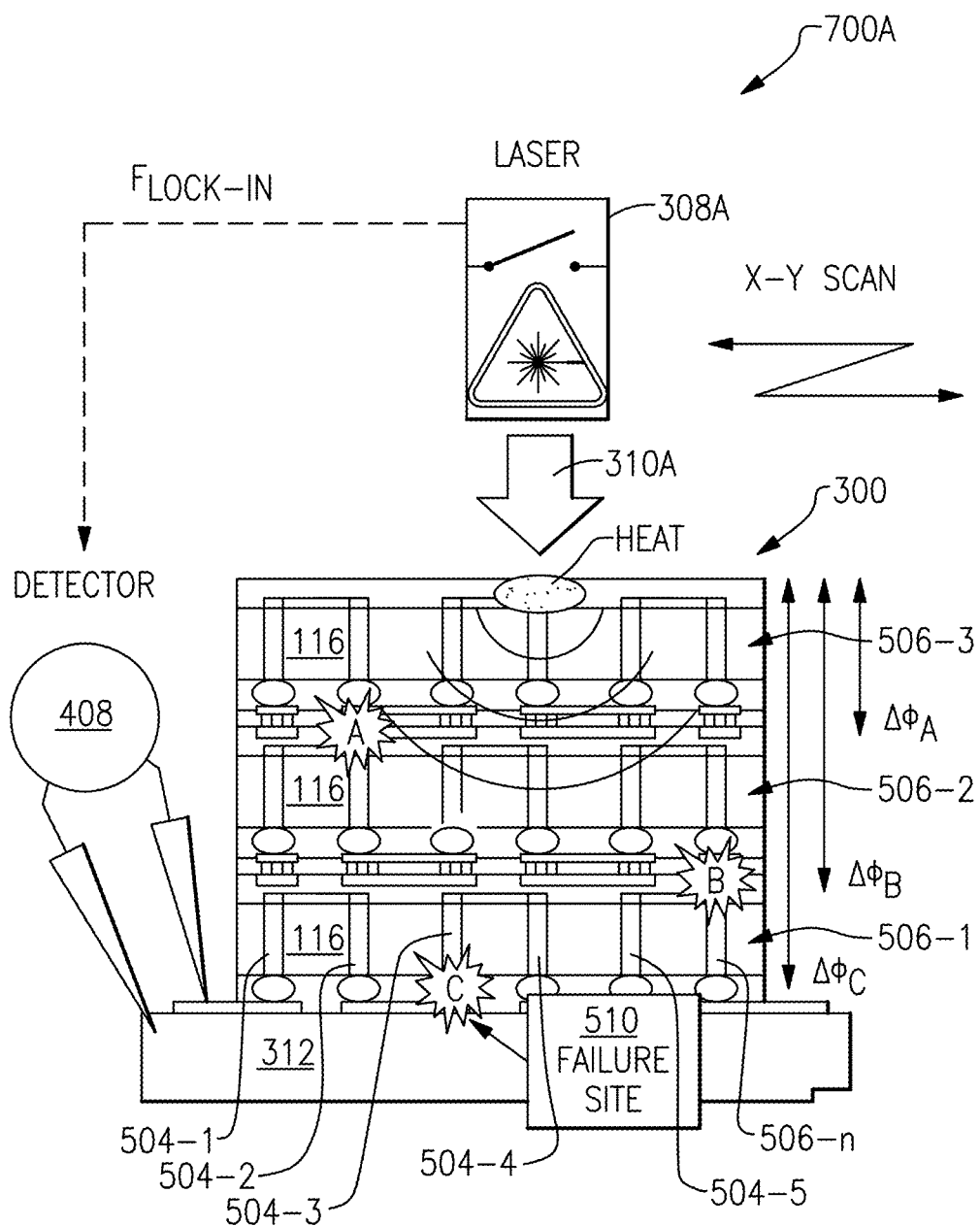
FIG. 9 schematically illustrates a system configured for detecting a manufacturing defect in a semiconductor region by locally heating using a beam of photons and measuring a change in capacitance, according to embodiments.

FIGS. 7A and 9 schematically illustrate a system and a method of detecting a manufacturing defect in a semiconductor region by locally heating using a beam 310A of photons and measuring a change in capacitance, according to embodiments. In the illustrated embodiment in FIG. 9, for illustrative purposes and without limitation, the plurality of electrically isolated conductive vias 504-1, 504-2, 504-3, . . . 504n may be connected as daisy chains described above. Referring to FIG. 9, the system 700A for detecting a location of a manufacturing defect 510 in a semiconductor device 300 includes a source 308A of a beam 310A of photons, e.g., a laser. The system 700A additionally includes a means for focusing the beam 310A of photons, e.g., one or more lenses and/or mirrors, to locally heat a volume within one of the semiconductor regions 506-1, 506-2, 506-3 to cause a temperature change therein from a first temperature to a second temperature. It will be appreciated that, to locally heat the volume to cause the temperature to change according to embodiments, the focused beam 310 of photons has relatively high power compared to techniques in which the a focused beam of photons may be used primarily to generate carriers by optical excitation. For example, the focused beam 310 of photons may have a power greater than 1 µW, 10 µW, 100 µW, 1 mW or 10 mW, or a value within a range defined by any of these values It will be appreciated that when the conductive via under test is located in the topmost semiconductor region 506-3, the change in capacitance is caused by direct heating by the focused beam 310 of photons. However, when the conductive via under test is located in a lower one of the semiconductor regions 506-1 or 506-2, the change in capacitance is caused by indirect heating, where heat from a hot spot that is initially formed in the topmost semiconductor region 506-3 subsequently heats the semiconductor region adjacent to the conductive via under test by thermal diffusion.

The system additionally includes a biasing means 408 for applying an electrical bias between one of the conductive vias 504-1, 504-2, 504-3, . . . 504n under test and a corresponding one of the semiconductor regions 506-1, 506-2, 506-3, to form a temperature-dependent depletion region therein. The system further includes a capacitance meter 408 configured to measure a first capacitance value and a second capacitance value between the one of the conductive vias 504-1, 504-2, 504-3, . . . 504n under test and the corresponding one of the semiconductor regions 506-1, 506-2, 506-3. The first capacitance and the second capacitance correspond to the first temperature and the second temperature, respectively, of the heated volume of the semiconductor region having the conductive via under test.

In the illustrated embodiment, the failure 510 is located below a surface of the semiconductor device 300, which is a 3D IC, e.g., in one of the IC dies that is not the topmost IC die, at a location that is not optically accessible. According to embodiments, the failure site 510 may be non-destructively determined based on construction of a map of the current path in the 3D IC device 300 through thermal laser stimulation. According to the method, thermal waves are generated in the device 300 with a laser, while the actual structure under test is used as a thermal wave detector. A lock-in scheme with pulsed laser excitation may be used to induce a periodic thermal wave inside the semiconductor device 300 under test. In some embodiments, the source 308A of the beam 310A of photons for generating thermal carriers may be a near-infrared (NIR) laser operating below the bandgap of the substrate 116, e.g., below 1.1 eV when the substrate is formed of silicon, which can advantageously avoid the photocurrent generated by inducing electron-hole pairs in the substrate, which could mask the thermal effect in the IC. Furthermore, a NIR laser also provides the opportunity for backside analysis due to the transparency of Si to infrared radiation.

FIG. 9 schematically illustrates the principle of a method according to embodiments, by way of example, using the semiconductor device 300 comprising a stack of ICs to determine the location of three conductive defects labeled A, B, and C. In one implementation, a square-wave intensity modulated laser beam is scanned over the surface of the topmost die to heat volumes of the semiconductor region 506 from a first temperature to a second temperature, in a similar manner as described above. The capacitance between the heated ones of the semiconductor regions 506 and the conductive vias 504-1, 504-2, 504-3, . . . 504n under test, which can be connected as a daisy chain, is measured with a capacitance meter 408. The capacitance meter 408 may synchronized to the pulsed laser beam to extract the phase therefrom. Depending on the location of the failure site, the corresponding thermal responses of the measured capacitance signals from defects A, B, and C may be different. The measured capacitance in depletion or inversion as described above may rise to a maximum value when the laser is switched on and decay during the switched off portion of the laser waveform. However, depending on the location, the resulting shape of the pulsed CV curve, including the amplitude, temporal offset from the square pulse of the laser and rising/falling behavior of the pulsed CV curve may be different. For example, a reduction in signal amplitude and increase in signal phase may be associated with increasing the vertical distance between the hot spot. Without being bound to any theory, these effects might be due to the fact that (1) the shape of the thermal response in the 3D IC is dependent on the thermal parameters of the device (i.e. heat conductivity, heat capacity, density); (2) when the heat has to travel through more material (e.g. from the top surface towards defect "C"), the maximum temperature point is reached at a later moment in time, causing the "rounding" of the thermal response; and (3) the maximum amplitude of the capacitance under inversion and depletion due to carrier generation decreases with increasing the distance between the thermal source and the defect. Based on the characteristics of the pulsed CV curve may be used to model the location of the manufacturing defect.

Figure 8:
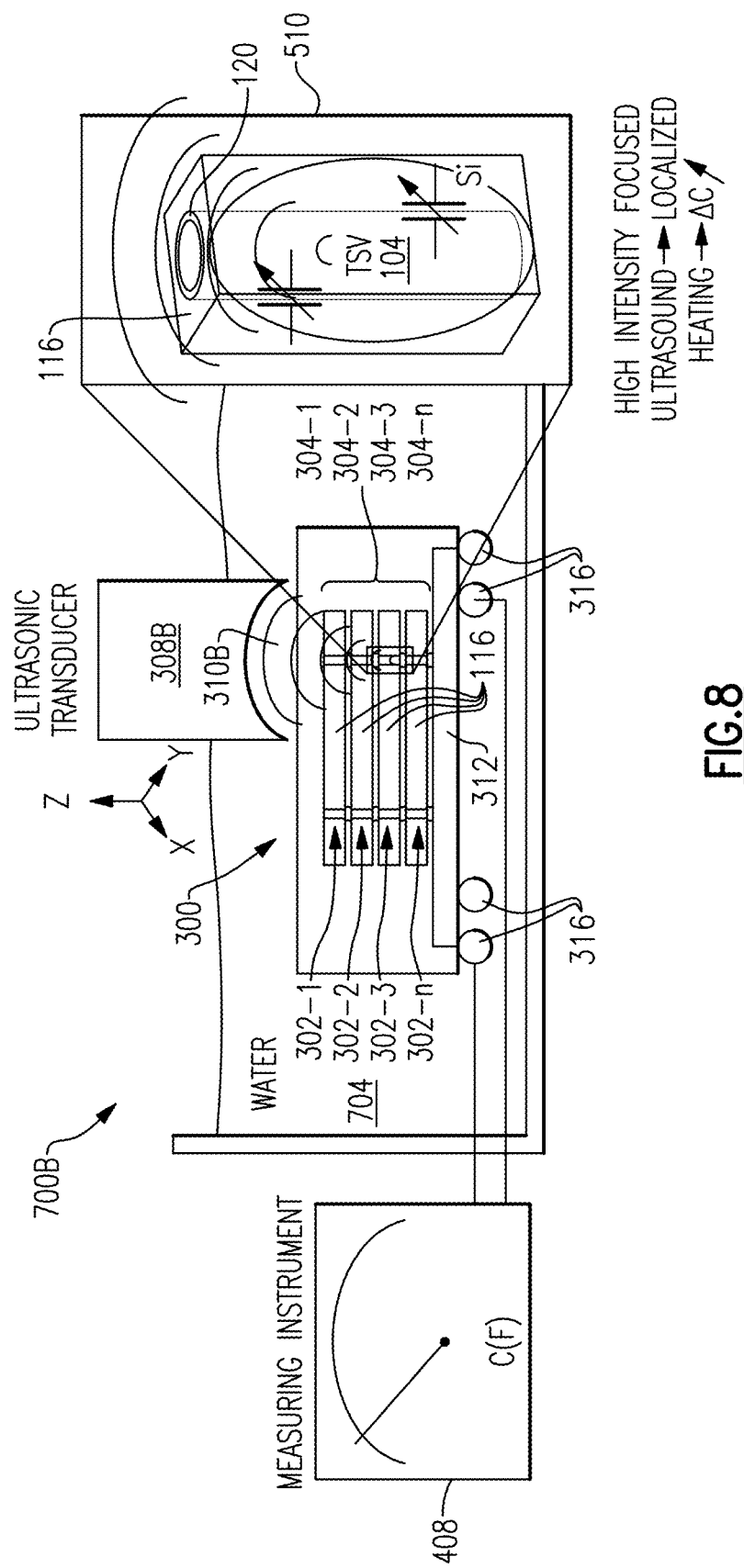
FIG. 8 schematically illustrates a system configured for detecting a manufacturing defect in a semiconductor region by locally heating using a beam of ultrasonic waves and measuring a change in capacitance, according to embodiments.

FIGS. 7B and 8 schematically illustrate a system and a method of detecting a manufacturing defect in a semiconductor region by locally heating using a beam 310B of ultrasound waves and measuring a change in capacitance, according to embodiments. The system 700B for detecting a location of a manufacturing defect 510 in a semiconductor device 300 includes a source 308B of a beam 310B of ultrasonic waves, e.g., an ultrasonic transducer. The system 700B additionally includes a means for focusing the beam 310B of ultrasonic waves, e.g., a concave shaped of the ultrasonic transducer, to locally heat a volume within a semiconductor region 302-1, 302-2, 302-3, . . . 302-n to cause a temperature change therein from a first temperature to a second temperature. The system 700B additionally includes a biasing means 408 for applying an electrical bias between one of the conductive vias 304-1, 304-2, 304-3, . . . 304n (FIG. 3) and the semiconductor region 302-1, 302-2, 302-3, . . . 302-n to form a temperature-dependent depletion region therein. The system 700B additionally includes a capacitance meter 408 configured to measure a first capacitance value and a second capacitance value between the one of the conductive vias 304-1, 304-2, 304-3, . . . 304n under test and the corresponding one of the semiconductor region 302-1, 302-2, 302-3, . . . 302-n. The first capacitance and the second capacitance correspond to the first temperature and the second temperature, respectively, of the heated volume of the semiconductor region 302-1, 302-2, 302-3, . . . 302-n having the conductive via under test. The system further includes an ultrasonic coupling medium 704, e.g., water, which can be held in a container. In the illustrated embodiment, the container is configured to hold sufficient ultrasonic coupling medium 704 to submerge the semiconductor device 300. However, embodiments are not so limited, and in other embodiments, the ultrasonic coupling medium 704 may be disposed in other forms, e.g., a droplet held by capillary force between the ultrasonic transducer 308B and the surface of the semiconductor device 300.

In the illustrated embodiment, the failure 510 is located below a surface of the semiconductor device 300, e.g., in one of the IC dies that is not the topmost IC die, at a location that is not optically accessible. According to embodiments, the failure site 510 is non-destructively determined by focusing the beam 310B at the failure location 510. A system including an ultrasonic transducer and various parameters for operating the same to heat a subsurface region of a semiconductor device structure are described, for example, in Matsui et al., Jap. J. of Appl. Phys. 56, 07JC11 (2017), the content of which is incorporated herein in its entirety.

FIG. 8 schematically illustrates the principle of the method, by way of example, implemented on the semiconductor device 300, which is a 3D IC, to determine the location of a subsurface failure 510. In one implementation, an ultrasonic transducer 308B generates a beam 310B of ultrasonic waves within a range of about 40 MHz and 100 MHz, and the transducer 308B and the semiconductor device 300 are acoustically coupled through the ultrasonic coupling medium 704, e.g., water. The transducer 308B may have a curved shape such that the beam 310B of ultrasonic waves can be focused with high energy density at or below the surface of the semiconductor device 300. In contrast to heating using a beam 310A of photons as described above, the beam 310B of ultrasonic waves can be focused to directly heat a subsurface volume of the semiconductor region. The frequency of the beam 310B of ultrasonic waves has been found to be proportional to the focused spot size, and according to embodiments, the frequency is between any two values of 10 MHz, 20 MHz, 50 MHz and 100 MHz. The resulting diameter of the focused spot size can be between any wo values of 1 µm, 10 µm, 20 µm, 50 µm, 100 µm and 200 µm. The capacitance between the heated ones of the semiconductor regions 302-1, 302-2, 302-3, . . . 302-n and the conductive vias 304-1m 304-2, 304-3, . . . 304-n under test, which can be connected as a daisy chain, is measured with a capacitance meter 408. The capacitance meter 408 may be synchronized to a pulsed ultrasonic beam. Depending on the location of the failure site, the corresponding thermal responses of the capacitance for defects may different. The measured change in capacitance due to local heating in a depletion regime or an inversion regime as described above may rise to a maximum value when the beam 310B is switched on and decay during the switched off portion of the pulsed ultrasonic beam. However, depending on the location, the resulting shape of the pulsed CV curve, including the amplitude, temporal offset from the square pulse of the ultrasonic beam and rising/falling behavior of the pulsed CV curve may be different. Based on the characteristics of the pulsed CV curve may be used to model the location of the manufacturing defect.

In the embodiments described above, apparatus, systems, and methods for detecting manufacturing defects in semiconductor devices are described in connection with particular embodiments. It will be understood, however, that the principles and advantages of the embodiments can be used for any other systems, apparatus, or methods with a need for monitoring wear-out. In the foregoing, it will be appreciated that any feature of any one of the embodiments can be combined and/or substituted with any other feature of any other one of the embodiments.

Aspects of this disclosure can be implemented as part of manufacturing processes of various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways.

Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A non-destructive method of detecting a manufacturing defect in a semiconductor device, the method comprising:
   providing a semiconductor device comprising an electrically isolated conductive via formed in a semiconductor region;
   locally heating the semiconductor region to cause a temperature change in a volume of the semiconductor region from a first temperature to a second temperature;
   applying an electrical bias between the conductive via and the semiconductor region to obtain a temperature-dependent depletion region in the semiconductor region;
   measuring a first capacitance value and a second capacitance value between the conductive via and the semiconductor region corresponding to the first temperature and the second temperature, respectively, of the volume of the semiconductor region; and
   detecting the manufacturing defect based on a difference between the first capacitance value and the second capacitance value attributable to a difference in a concentration of thermally generated electrical carriers in the depletion region caused by a temperature difference between the first temperature and the second temperature.

2. The method of claim 1, wherein the semiconductor region is formed in a semiconductor substrate, and wherein the conductive via is a through-substrate via (TSV) formed through the semiconductor substrate.

3. The method of claim 1, wherein the conductive via comprises an insulating layer interposed between the semiconductor region and the conductive via, such that the capacitance comprises a capacitance of a conductive material/insulator/semiconductor stack.

4. The method of claim 1, wherein applying the electrical bias comprises applying a voltage having a polarity and a magnitude that induces a depletion region in the volume of the semiconductor region.

5. The method of claim 4, wherein locally heating comprises generating sufficient heat in the volume of the semiconductor region to cause the temperature difference that is greater than 20° C., and to increase the concentration of thermally generated electrical carriers in the depletion region.

6. The method of claim 1, wherein locally heating comprises absorbing optical energy into the semiconductor volume by focusing a laser beam.

7. The method of claim 1, wherein locally heating comprises absorbing ultrasonic energy into the semiconductor volume by focusing ultrasound waves.

8. The method of claim 7, further comprising providing a liquid medium adapted to couple the ultrasound waves between the semiconductor device and an ultrasound wave source.

9. The method of claim 1, wherein providing the semiconductor device comprises providing a three-dimensionally (3D) stacked set of integrated circuit (IC) dies.

10. The method of claim 9, wherein the semiconductor region is located below a surface of the semiconductor device at a location that is not optically accessible.

11. The method of claim 1, wherein measuring the first capacitance and the second capacitance comprises measuring in an environment having insufficient illumination to induce photogeneration of electrical carriers in the semiconductor region.

12. A non-destructive method of detecting a location of a manufacturing defect in a semiconductor device, the method comprising:
providing a semiconductor device comprising a plurality of electrically isolated conductive vias formed in a semiconductor region;
scanning a focused energetic beam in a raster format across the conductive vias, thereby locally heating to cause a temperature change in a volume of the semiconductor region adjacent to each of the conductive vias from a first temperature to a second temperature;
applying an electrical bias between the each of the conductive vias and the semiconductor region to obtain a temperature-dependent depletion region in the volume of the semiconductor region adjacent to the each of the conductive vias;
measuring a first capacitance value and a second capacitance value between the each of the conductive vias and the semiconductor region, the first capacitance value and the second capacitance value corresponding to the first temperature and the second temperature, respectively, of the volume of the semiconductor region adjacent to the each of the conductive vias; and
determining a location of the manufacturing defect based on a difference between the first capacitance value and the second capacitance value attributable to a difference in a concentration of thermally generated electrical carriers in the depletion region caused by a temperature difference between the first temperature and the second temperature.

13. The method of claim 12, wherein the focused energetic beam comprises ultrasonic waves.

14. The method of claim 12, wherein the focused energetic beam comprises a laser beam.

15. The method of claim 12, wherein the semiconductor region is formed in a semiconductor substrate, and wherein the conductive vias are through-substrate vias (TSVs).

16. The method of claim 12, wherein measuring the first capacitance and the second capacitance comprises measuring a capacitance that is at least partly induced by a depletion region formed in the volume of the semiconductor region corresponding to the each of the plurality of conductive vias.

17. The method of claim 12, wherein providing the semiconductor device comprises providing a three-dimensionally (3D) stacked set of integrated circuit (IC) dies.

18. The method of claim 17, wherein the semiconductor region is formed in one of the 3D stacked IC dies that is positioned below and overlapped by another one of the 3D stacked IC dies.

19. The method of claim 12, further comprising generating a two- or three-dimensional capacitance difference map indicating the location of the manufacturing defect.

* * * * *